United States Patent [19]

Wiesa et al.

[11] Patent Number: 5,539,618
[45] Date of Patent: Jul. 23, 1996

[54] ELECTRICAL DEVICE, IN PARTICULAR SWITCHING OR CONTROLLING DEVICE FOR MOTOR VEHICLE

[75] Inventors: Thomas Wiesa, Vaihingen; Ralph Schimitzek, Moeckmuehl, both of Germany

[73] Assignee: Robert Bosch GmbH, Stuttgart, Germany

[21] Appl. No.: 461,671

[22] Filed: Jun. 5, 1995

Related U.S. Application Data

[63] Continuation of Ser. No. 264,436, Jun. 23, 1994, abandoned.

[30] Foreign Application Priority Data

Aug. 6, 1993 [DE] Germany ............... 43 26 506.5

[51] Int. Cl.[6] ........................................... H05K 7/20
[52] U.S. Cl. ........................... 361/720; 174/252
[58] Field of Search .................... 174/16.3, 252, 174/266; 361/704–722, 751, 808

[56] References Cited

U.S. PATENT DOCUMENTS 4,628,407  12/1986  August et al. ............ 361/711
5,285,352  8/1994  Pastore et al. ............ 361/707

FOREIGN PATENT DOCUMENTS 3115017  4/1982  Germany .
4023319  12/1991  Germany .
4107312  10/1992  Germany .
2135521  8/1984  United Kingdom .

*Primary Examiner*—Gregory D. Thompson
*Attorney, Agent, or Firm*—Michael J. Striker

[57] ABSTRACT

An electrical device has a printed circuit foil carrying an electrical circuit and having a throughgoing opening, a heat conductive carrier plate located at a lower side of the foil, a heating power conductor located at an upper side of the foil, and a solderable edge layer located at the upper side of the printed circuit foil under the power component having dimensions corresponding to the dimensions of the power component. The edge layer limits the throughgoing opening and the foil from inside. The throughgoing opening has a side which is measured parallel to the upper side of the foil and is greater than a corresponding size of the edge layer. The throughgoing opening is filled with a heat conductive mass.

3 Claims, 1 Drawing Sheet

ELECTRICAL DEVICE, IN PARTICULAR SWITCHING OR CONTROLLING DEVICE FOR MOTOR VEHICLE

This is a continuation of application Ser. No. 08/264,436 filed Jun. 23, 1994, now abandoned.

BACKGROUND OF THE INVENTION

The present invention relates to an electrical device, and in particular a switching and controlling device for a motor vehicle.

More particularly, it relates to such an electrical device which has a printed circuit foil carrying an electronic circuit and applied with its lower side on a heat conductive carrier plate and provided on its upper side with at least one heatable power component.

Such electrical devices are known in the art. One of such devices is disclosed, for example in the German document DE-PS 40 23 319. This electrical device has an electronic circuit with a base element and a printed board formed as a printed circuit foil and provided with conductor tracks or switching structures. A plurality of discrete components are connected with the printed circuit foil, and one or several components form so called power components which are heated during the operation of the circuit or the electrical device. The printed circuit foil is applied on a carrier plate which on the one hand mechanically stabilizes the printed circuit foil and on the other hand operates for heat withdrawal of heat generated by the power components. The carrier plate is composed for this purpose from a good heat conducting material, for mechanical materials such as aluminum or a similar material. Power elements in SMD-structure (SMD=Surface-Mounted-Device) must be applied in such electrical devices on the upper surface of the printed circuit foil facing away from the carrier plate. The heat transport from the power component to the heat conductive support plate must be performed therefore through the printed circuit foil. However, conventional printed circuit foils act in disadvantageous manner as heat insulators, since their heat conductivity is substantially lower than the heat conductivity of a (metallic) carrier plate. For improving the heat withdrawal from the SMD power element to the heat conductive support plate, it is known to provide the printed circuit foil under the applied power element with through contacts. Such through contacts are composed as a rule of openings extending through the printed circuit foil and having small diameter. On the upper side or on the lower side of the printed circuit foil they are surrounded by a substantially circular heat conductive coating, for example solder sheet, and the sheets on the upper side and the lower side are connected with one another in a heat conductive manner. The opening diameters of conventional through contacts is at most less than 1 mm. Due to the geometry of these through contacts in the construction having a plurality of the through contacts under a single power component, often an insufficient heat transmission from the power component to the carrier is obtained.

SUMMARY OF THE INVENTION

Accordingly, it is an object of the present invention to provide an electrical device, in particular a switching or controlling device for a motor vehicle, which avoids the disadvantages of the prior art.

In keeping with these objects and with others which will become apparent hereinafter, one feature of the present invention resides, briefly stated, in an electrical device of the above mentioned general type in which a solderable edge sheet is formed on the upper side of the printed circuit foil under the power component and its outer sizes substantially corresponds to the outer sizes of the power component, the edge sheet limits in the printed circuit foil a throughgoing opening with an extension parallel to the upper side and greater than the corresponding extension of the edge sheet, and the recess is filled with a heat conductive mass.

When the electrical device is designed in accordance with the present invention, it eliminates the disadvantages of the prior art and provides for advantageous results. In particular, a substantially better heat transport from the power component to the heat conductive carrier plate is provided with low manufacturing costs. With the inventive construction of the printed circuit foil, an approximately unhindered heat transport is provided from the power component to the support plate without substantial insulating action occurring due to the printed circuit foil. When compared with conventional printed circuit foils having through contacts, in the present invention a substantially higher heat conductivity is obtained in the region of the power component.

In accordance with a further feature of the present invention, the printed circuit foil on its lower side is at least partially provided with a heat conductive layer. In this construction the heat withdrawal from the power component to the heat conductive support plate is substantially improved.

Still a further feature of the present invention is that the solderable edge layer on the upper side of the printed circuit foil is connected with the heat conductive layer on the lower side. In this construction the heat transport to the printed circuit foil is further improved.

Finally, in accordance with a further especially advantageous feature of the present invention, the heat conductive mass in the recess of the printed circuit foil is a solder paste which is utilized for assembling the printed circuit foil.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
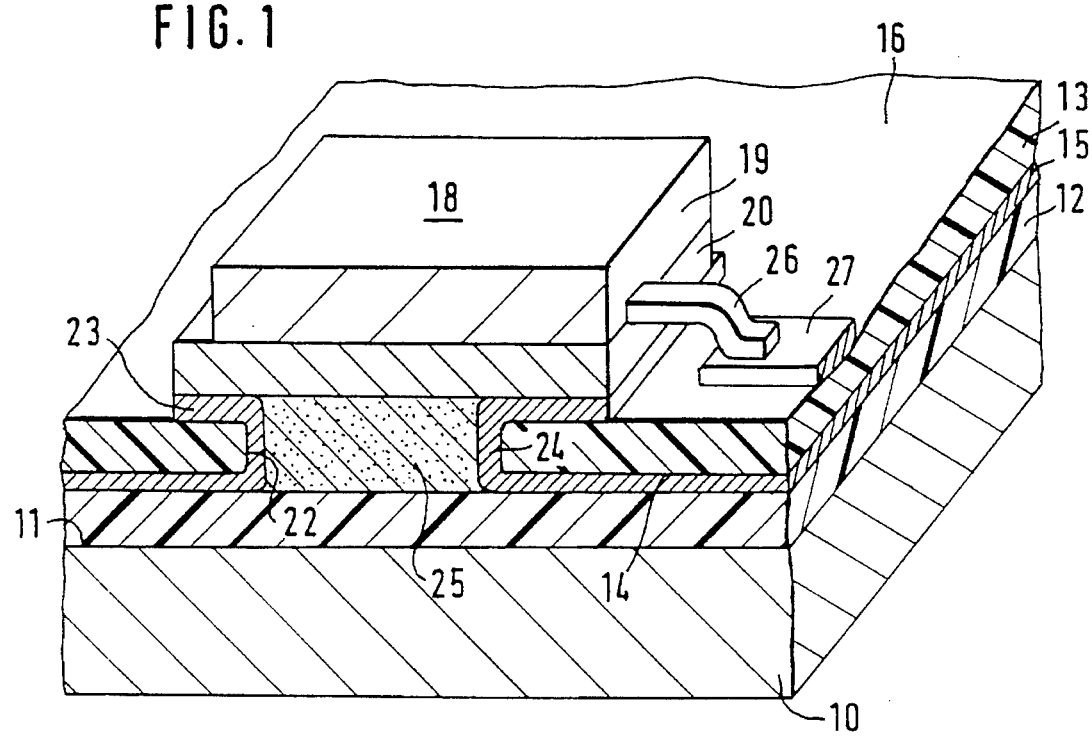
FIG. 1 is a view showing a section through a partially shown assembled printed circuit foil.
Figure 2:
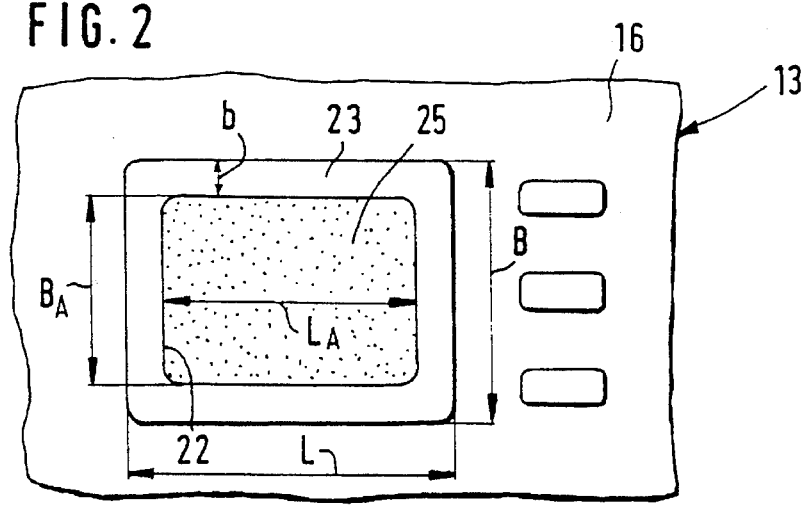
FIG. 2 is a plan view of a not assembled printed circuit foil.

FIG. 1 shows a carrier plate which is identified with reference numeral 10 and composed of good heat conductive material. The carrier plate 10 can be composed for example of a metallic material, such as aluminum. An insulating layer 12 is applied on an upper side 11 of a carrier plate 10. A known printed circuit foil 13 is applied on the insulating layer 12 and provided at its lower side 14 with a heat conductive layer 15. The heat conductive layer 15 can be formed for example with a thin copper layer. The upper side 16 is provided in a not shown manner with conductor tracks which connect individual components with an electronic circuit. A power component 18 is SMD structure is shown in FIG. 1 as one of the components. The power components 18 during the operation generate heat to be withdrawn. They are composed of a base body 19 and a solderable lower part 20 which also serves as a cooling surface.

The SMD power components 18 are applied on the upper side 16 of the printed circuit foil 13 in a known manner and connected with the conductor tracks.

The printed circuit foil 13 is provided inside the surface limited by the power component 18, with a throughgoing recess 22. The edge sizes of the recess are smaller than the corresponding sizes of the SMD power element 18. The recess 22 is surrounded on the upper side 16 of the printed circuit foil 13 with a solderable edge layer 23. The dimensions of the edge layer 23 substantially correspond to the dimensions of the lower part 20 of the SMD power component 18. The power component 18 has in the shown embodiment a substantially rectangular base surface. However, it can have also a different base surface. In this embodiment the edge layer 23 limits a surface under the power element 18. The length of this surface L and the width of this surface B substantially correspond to the length and width of the lower part 20. The solderable edge layer 23 is usually a thin copper layer similarly to the heat conductive layer 15 and is connected with the latter by a collar-shaped layer 24 extending over the edge of the recess 22. The recess 22 is filled with a heat conductive mass 25 which usually is a known solder paste for the SMD assembling.

The SMD power component 18 is placed with its lower part 20 on the upper side 16 of the printed circuit foil so that the recess 22 and the edge layer 23 overlap one another. The connecting elements 26 (connecting pins) are located on the solderable contact surfaces 27 on the printed circuit foil 13, which are connected with the conductor paths. The SMD power component 18 is mechanically and electrically conductively connected with the conductor foil 13 or the electronic circuit by soldering its lower part with the edge layer 13 and by soldering of the connecting element 26 on the contact surface 27 with the conductor foil 13 or the electronic circuit.

The assembling of the printed circuit foil 13 with the SMD components is performed in a known manner by applying a soldering paste on the upper side 16 of the printed circuit foil, so as to cover the portions of the edge layer 23 and the contact surface 27 to be soldered. The portions of the printed circuit foil provided with the soldering paste in this manner is placed on the power component or components and connected with a soldering process (for example reflow-soldering) with the printed circuit foil 13.

The heat conductive mass 25 in the recess 22 is preferably also a soldering paste as used for assembling the printed circuit foil. Therefore, the recess 22 can be filled by applying the soldering paste during the assembling process. During the soldering process, this heat conductive mass (soldering paste) is melted inside the recess 22 and produces a firm and highly heat conductive connection between the lower part 20 of the power component 18 and the heat conductive support plate 10.

In the shown embodiment of the SMD power component 18 the lower part 20 has a base surface of approximately 16 mm in length L and 12 mm in width B. The edge layer 23 has corresponding sizes L,B. The width b of the peripheral edge layer 23 amounts to approximately 2 mm, so that the sizes of the recess 22 are substantially 12 mm in length $L_A$ and 8 mm in width $B_A$. The length $L_A$ and the width $L_B$ of the recess 22 is thereby substantially greater than the corresponding extension (width) b of the edge layer 23. Thereby in the shown embodiment the area of the recess 22 which is filled with the heat conductive mass 25 amounts to approximately 50% of the total area of the lower part 20 and assumes the whole space limited by the edge layer 23. The sizes of the SMD power component 18 or its lower part 20 and the edge layer 23 or the recess 22 are shown of course only exemplary.

During the assembling of the printed circuit foil 13 with the SMD power elements 18 it is advisable to adjust the outer sizes of the edge layer 23 to the outer sizes of a corresponding power component and to approximate the width b of the edge sheet to the assumptions required for sufficient mechanical mounting. The recess 22 or the heat conductive mass 25 can therefore occupy the whole space limited by the edge layer 23 and therefore form a correspondingly large-area heat transferring surface.

The recess 22 can be made during manufacture of the printed circuit foil 13 by a simple punching process.

In contrast to the shown embodiment, the printed circuit foil 13 or the carrier plate 10 can dispense with the insulating layer 12 when the carrier plate 10 is composed of an electrically non-conductive material.

It will be understood that each of the elements described above, or two or more together, may also find a useful application in other types of constructions differing from the types described above.

While the invention has been illustrated and described as embodied in an electrical device in particular switching or controlling device for motor vehicle, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An electrical device, in particular switching or controlling device for a motor vehicle, comprising a printed circuit foil carrying an electric circuit and having a lower side and an upper side, said printed circuit foil having a throughgoing opening; a heat conductive carrier plate located below said printed circuit foil in heat enhancement with said foil; a heating power component located at said upper side of said printed circuit foil in a surface-mounted-device assembly; a solderable edge layer located at said upper side of said printed circuit foil under said power component and connected with said power component, said edge layer having dimensions substantially corresponding to the dimensions of said power component, said edge layer having a portion which transversely limits said throughgoing opening from inside, said throughgoing opening having a transverse size which is greater than the corresponding transverse size of said edge layer; a heat conductive layer located at said lower side of said printed circuit foil between said printed circuit foil and said heat conductive carrier plate and conductively connected with said edge layer through said portion; and a heat conductive mass which fills said throughgoing opening.

2. An electrical device as defined in claim 1, wherein said heat conducting mass is a soldering paste.

3. An electrical device, in particular switching or controlling device for a motor vehicle, comprising a printed circuit foil carrying an electric circuit and having a lower side and an upper side, said printed circuit foil having a throughgoing opening; a heat conductive carrier plate located below said printed circuit foil in heat enhancement with said foil; a heating power component located at said upper side of said printed circuit foil in a surface-mounted-device assembly; a solderable edge layer located at said upper side of said printed circuit foil under said power component and connected with said power component, said edge layer having dimensions substantially corresponding to the dimensions of said power component, said edge layer having a portion which transversely limits said throughgoing opening from inside, said throughgoing opening having a transverse size which is greater than the corresponding transverse size of said edge layer; a heat conductive layer located at said lower side of said printed circuit foil between said printed circuit foil and said heat conductive carrier plate and conductively connected with said edge layer through said portion; a heat insulating plate arranged between said heat conductive layer and said carrier plate; and a heat conductive mass which fills said throughgoing opening.

* * * * *